United States Patent
Ge et al.

(10) Patent No.: US 11,955,341 B2
(45) Date of Patent: Apr. 9, 2024

(54) ETCHING SOLUTION AND METHOD FOR SELECTIVELY REMOVING SILICON NITRIDE DURING MANUFACTURE OF A SEMICONDUCTOR DEVICE

(71) Applicant: Versum Materials US, LLC, Tempe, AZ (US)

(72) Inventors: Jhih Kuei Ge, New Taipei (TW); Yi-Chia Lee, Chupei (TW); Wen Dar Liu, Chupei (TW)

(73) Assignee: Versum Materials US, LLC, Tempe, AZ (US)

( * ) Notice: Subject to any disclaimer, the term of this patent is extended or adjusted under 35 U.S.C. 154(b) by 129 days.

(21) Appl. No.: 17/432,992

(22) PCT Filed: Mar. 10, 2020

(86) PCT No.: PCT/US2020/021865
§ 371 (c)(1),
(2) Date: Aug. 23, 2021

(87) PCT Pub. No.: WO2020/185762
PCT Pub. Date: Sep. 17, 2020

(65) Prior Publication Data
US 2022/0157613 A1 May 19, 2022

Related U.S. Application Data

(60) Provisional application No. 62/816,806, filed on Mar. 11, 2019.

(51) Int. Cl.
| | | |
|---|---|---|
| H01L 21/311 | (2006.01) | |
| C09K 13/04 | (2006.01) | |
| C09K 13/06 | (2006.01) | |
| H01L 21/02 | (2006.01) | |
| H01L 21/306 | (2006.01) | |
| H01L 21/3213 | (2006.01) | |

(52) U.S. Cl.
CPC ........ *H01L 21/31111* (2013.01); *C09K 13/04* (2013.01); *C09K 13/06* (2013.01); *H01L 21/02126* (2013.01); *H01L 21/30604* (2013.01); *H01L 21/32133* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 9,691,629 B2 | 6/2017 | Cooper et al. | |
| 2005/0159011 A1 | 7/2005 | Thirumala et al. | |
| 2008/0203060 A1 | 8/2008 | Hara et al. | |
| 2015/0247087 A1* | 9/2015 | Kamimura | C09K 13/10 252/79.3 |
| 2015/0299628 A1* | 10/2015 | Choi | C23C 22/63 510/254 |
| 2016/0130500 A1 | 5/2016 | Chen et al. | |
| 2016/0200975 A1* | 7/2016 | Cooper | H01L 21/31111 216/13 |
| 2018/0346811 A1* | 12/2018 | Lee | H01L 21/465 |

FOREIGN PATENT DOCUMENTS

| | | | | |
|---|---|---|---|---|
| CN | 101605869 A | | 12/2009 | |
| JP | 2009021538 | * | 1/2009 | ......... H01L 21/306 |
| KR | 20170009240 | * | 1/2017 | ............ C09K 13/06 |
| KR | 20170059170 A | | 6/2017 | |
| WO | 2012174518 A2 | | 12/2012 | |
| WO | WO2012174518 | * | 12/2012 | |
| WO | 2017112732 A1 | | 6/2017 | |

OTHER PUBLICATIONS

PCT Written Opinion of the International Search Authority dated Jul. 8, 2020. (Year: 2020).*
IPOS; Intellectual Property Office of Singapore; Search Report; dated Nov. 25, 2022.
International Search Report; PCT/US2020/021865; dated Jul. 7, 2020.

* cited by examiner

*Primary Examiner* — Jiong-Ping Lu
(74) *Attorney, Agent, or Firm* — William T. Slaven, IV

(57) ABSTRACT

Described herein is an etching solution and the method of using the etching solution comprising water, phosphoric acid solution (aqueous), an organosilicon compound as disclosed herein, and a hydroxyl group-containing water-miscible solvent. Such compositions are useful for the selective removal of silicon nitride over silicon oxide.

17 Claims, No Drawings

ETCHING SOLUTION AND METHOD FOR SELECTIVELY REMOVING SILICON NITRIDE DURING MANUFACTURE OF A SEMICONDUCTOR DEVICE

CROSS-REFERENCE TO RELATED APPLICATIONS

This application is a national stage application, filed under 35 U.S.C. § 371, of International Patent Application No. PCT/US2020/021865 (filed on 10 Mar. 2020) which claims the benefit of U.S. Provisional Patent Application No. 62/816,806 (filed on 11 Mar. 2019) each of which applications is incorporated herein by reference in their entirety.

BACKGROUND OF THE INVENTION

Exemplary embodiments of the present invention relate to an etching composition, and more particularly, to a high-selectivity etching composition capable of selectively removing a nitride film while minimizing the etch rate of an oxide film and to a method for fabricating a semiconductor, which includes an etching process employing the etching composition.

Selective $Si_3N_4$ sacrificial removal is one of the critical steps for 3D NAND memory device fabrication. After the etch process, $Si_3N_4$ is removed, leaving the $SiO_2$ core with $SiO_2$ fins unchanged. Traditionally, an $Si_3N_4$ etch could be accomplished by hot phosphoric acid at 160° C., however, the selectivity of the $Si_3N_4$ etch relative to a silicon or silicon oxide material is generally low.

As semiconductor devices become more highly integrated, the reliability and electrical characteristics of the semiconductor devices are more susceptible to damage or deformation of the layers constituting the semiconductor device. Therefore, when an etching process is performed to remove a specific material layer selectively using an etchant, it is desirable that the etchant should have a higher etch selectivity with respect to other material layers and the etching process generate less byproduct to reduce process defects.

With such high integration, therefore, the material selectivity requirement for selective $Si_3N_4$ sacrificial removal in 3D NAND fabrication becomes more critical—to the point where it is desired to effectively leave the $SiO_2$ layer unchanged while etching the $Si_3N_4$ layer. Thus, there is a need in the art to further suppress the $SiO_2$ etch rate to achieve an even higher $Si_3N_4$ to $SiO_2$ selectivity.

BRIEF SUMMARY OF THE INVENTION

In one aspect, the present invention provides an etching solution suitable for the selective removal of silicon nitride over silicon oxide from a microelectronic device, which comprises: water; phosphoric acid solution (aqueous); an organosilicon compound having a chemical structure represented by Formula A:

$$(R^4O)_{3-m}SiR^2R^3{}_m \qquad\qquad A$$

wherein $R^2$ and $R^3$ are each independently selected from a hydrogen atom, a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group, a $C_2$ to $C_{10}$ linear or branched alkynyl group, and a functional group-containing moiety, wherein the functional group is at least one selected from the group consisting of vinyl, epoxy, styryl, methacyloxy, acyloxy, amino, ureide, isocycanate, isocyanurate, and mercapto; $R^4$ is selected from a $C_1$ to $C_{10}$ linear alkyl group, a $C_3$ to $C_{10}$ branched alkyl group, a $C_3$ to $C_{10}$ cyclic alkyl group, a $C_1$ to $C_{10}$ linear or branched alkenyl group, and a $C_1$ to $C_{10}$ linear or branched alkynyl group, a $C_5$-$C_{12}$ aryl group and wherein m=0, 1, or 2; and a hydroxyl group-containing water-miscible solvent.

In another aspect, the present invention provides a method of selectively enhancing the etch rate of silicon nitride relative to silicon dioxide on a composite semiconductor device (or microelectronic device) comprising silicon nitride and silicon dioxide, the method comprising the steps of: contacting the composite semiconductor device (or microelectronic device) comprising silicon nitride and silicon dioxide with a composition comprising: water; phosphoric acid solution (aqueous); an organosilicon compound having a chemical structure represented by Formula A:

$$(R^4O)_{3-m}SiR^2R^3 \qquad\qquad A$$

wherein $R^2$ and $R^3$ are each independently selected from a hydrogen atom, a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group, a $C_2$ to $C_{10}$ linear or branched alkynyl group, and a functional group-containing moiety, wherein the functional group is at least one selected from the group consisting of vinyl, epoxy, styryl, methacyloxy, acyloxy, amino, ureide, isocycanate, isocyanurate, and mercapto; $R^4$ is selected from a $C_1$ to $C_{10}$ linear alkyl group, a $C_3$ to $C_{10}$ branched alkyl group, a $C_3$ to $C_{10}$ cyclic alkyl group, a $C_3$ to $C_{10}$ linear or branched alkenyl group, and a $C_3$ to $C_{10}$ linear or branched alkynyl group, a $C_5$-$C_{12}$ aryl group and wherein m=0, 1, or 2; and a hydroxyl group-containing water-miscible solvent; and rinsing the composite semiconductor device (or microelectronic device) after the silicon nitride is at least partially removed, wherein the selectivity of the etch for silicon nitride over silicon oxide is over about 1000.

The embodiments of the invention can be used alone or in combinations with each other.

This invention provides high selectivity for silicon nitride over silicon oxide, which is particularly important as the numbers of alternating layers of silicon nitride and silicon oxide in memory devices during their fabrication increases to above 30, or above 40 or above 48, or more.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the selective removal of silicon nitride over silicon oxide from a microelectronic device having such material(s) thereon during its manufacture.

For ease of reference, "microelectronic device" corresponds to semiconductor substrates (wafers), flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly. The term "semiconductor device" may be used interchangeably with microelectronic device. The term "composite" may be used to describe either semiconductor device or microelectronic device to indicate that there are more than one type of material present in one or more layers, films, patterns, vias, etc in or on the semiconductor device, one layer may be the substrate, which may be a silicon wafer.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 1 wt. %, preferably less than 0.5 wt. %, more preferably less than 0.1 wt. % and more preferably less than 0.01 wt %. "Substantially free" also includes 0.000 wt. %. The term "free of" means 0.000 wt. % or less.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In the broad practice of this aspect, the etching solution of the present development comprises, consists essentially of, or consists of water, phosphoric acid, an organosilicon compound as disclosed herein, and a hydroxyl group-containing water-miscible solvent.

In some embodiments, the etching solution compositions disclosed herein may be formulated to be substantially free of at least one of the following chemical compounds: hydrogen peroxide and other peroxides, ammonium ions, ammonium salts, for examples, ammonium citrate, ammonium acetate and ammonium sulfate, fluoride ions, hydrofluoric acid, ammonium fluoride, fluorine-containing compounds, sulfur-containing compounds and abrasives.

In other embodiments, the etching solution compositions disclosed herein are formulated to be free of at least one of the following chemical compounds: hydrogen peroxide and other peroxides, ammonium ions, fluoride ions, and abrasives.

Water

The etching compositions of the present development comprise water. In the present invention, water functions in various ways such as, for example, to dissolve one or more components of the composition, as a carrier of the components, as an aid in the removal of residue, as a viscosity modifier of the composition, and as a diluent. Preferably, the water employed in the etching composition is de-ionized (DI) water. In some embodiments, the water will be added to the composition only by introducing other components to the composition that are typically or only commercially available in an aqueous solution, for example the phosphoric acid, described below.

It is believed that, for most applications, water will comprise, for example, from about 1.0% to about 20% by wt. of the etching composition. Other preferred embodiments of the present invention could comprise from about 5.0% to about 15% by wt. of water. Still other preferred embodiments of the present invention could include water in an amount to achieve the desired weight percent of the other ingredients. The amount of water in the composition of this invention may be any amount defined by a range having any combination of the endpoints selected from the following weight percents: 1, 2, 3, 4, 5, 6, 7, 8, 9, 10, 11, 12, 13, 14, 15, 16, 17, 18, 19, 20. In alternative examples, water will comprise from about 8% to about 18% by wt. or from about 10% to about 18% by wt. of the etching composition.

Phosphoric Acid

The etching compositions of the present invention comprise phosphoric acid. The phosphoric acid functions primarily to etch silicon nitride. Commercial grade phosphoric acid can be used. Typically, the commercially available phosphoric acid is available as 80% to 85% aqueous solutions. In a preferred embodiment electronic grade phosphoric acid solutions are employed wherein such electronic grade solutions typically have a particle count below 100 particles/ml, and wherein the size of the particles is less than or equal to 0.5 microns and metallic ions are present in the acid in the low parts per million to parts per billion level per liter. In certain embodiments, no other acids such as, for example, hydrofluoric acid, nitric acid or mixtures thereof are added to the solution of the present invention.

It is believed that, for most applications, the amount of phosphoric acid (aqueous solution) can comprise from about 70% to about 99.99%, or from about 70% to about 95% by weight of the composition. The amount of phosphoric acid on a neat basis, that is, excluding the water in the phosphoric acid solution added to the composition of this invention may be from about 55% to about 85%, or from about 55% to about 85% by weight of the composition. Alternatively, the amount of phosphoric acid added to the composition on a neat basis may be any amount defined by a range having any combination of the endpoints selected from the following weight percents: 55, 58, 60, 62, 65, 67, 70, 71, 72, 73, 74, 75, 76, 77, 78, 79, 80, 81, 82, 83, 84 and 84.96, such as, from about 55% to about 84.86%, or from about 60% to about 84%, or from about 70% to about 84%, or from about 75% to about 83% by weight of the composition. For the purpose of clarity, if 10 grams of an 85% aqueous phosphoric acid solution is added to the composition, then 8.5 grams of phosphoric acid and 1.5 grams of water will be added to the composition; therefore, on a neat basis, 8.5 grams of phosphoric acid was added to the composition and 1.5 grams of water is added to the total amount of water in the composition.

Hydroxyl Group-Containing Water-Miscible Solvent

The etching compositions of the present invention comprise a hydroxyl group-containing water-miscible solvent. The hydroxyl group-containing water-miscible solvent functions primarily to protect the silicon oxide such that the silicon nitride is etched preferentially and selectively and may also enhance the miscibility between the phosphoric acid and any other components added to the composition.

Classes of hydroxyl group-containing water-miscible solvents include, but are not limited to, alkane diols and polyols (including, but not limited to, alkylene glycols), glycols, alkoxyalcohols (including but not limited to glycol monoethers), saturated aliphatic monohydric alcohols, unsaturated non-aromatic monohydric alcohols, and low molecular weight alcohols containing a ring structure.

Examples of water soluble alkane diols and polyols such as ($C_2$-$C_{20}$) alkanediols and ($C_3$-$C_{20}$) alkanetriols including, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, and pinacol.

Examples of water soluble alkylene glycols include, but are not limited to, ethylene glycol, propylene glycol, diethylene glycol, dipropylene glycol, triethylene glycol and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether and ethylene glycol monobenzyl ether, diethylene glycol monobenzyl ether, and mixtures thereof.

Examples of water soluble saturated aliphatic monohydric alcohols include, but are not limited to methanol, ethanol, n-propyl alcohol, isopropyl alcohol, 1-butanol, 2-butanol, isobutyl alcohol, tert-butyl alcohol, 2-pentanol, t-pentyl alcohol, 1-hexanol, and mixtures thereof.

Examples of water soluble unsaturated non-aromatic monohydric alcohols include, but are not limited to allyl alcohol, propargyl alcohol, 2-butenyl alcohol, 3-butenyl alcohol, 4-penten-2-ol, and mixtures thereof.

Examples of water soluble, low molecular weight alcohols containing a ring structure include, but are not limited to, alpha-terpineol, tetrahydrofurfuryl alcohol, furfuryl alcohol, 1,3-cyclopentanediol, and mixtures thereof.

It is believed that, for most applications, the amount of hydroxyl group-containing water-miscible solvent will comprise from about 1.0% to about 30%, or about 3% to about 25% by weight of the composition. When employed, the hydroxyl group-containing water-miscible solvent may comprise from about 3% to about 15%, or from about 5% to about 15% by weight of the composition. Additionally, the amount of hydroxyl group containing water-miscible solvent in the composition of this invention may be any amount defined by a range having any combination of the endpoints selected from the following weight percents: 0.5, 1, 2, 3, 4, 5, 6, 7, 8, 9, 10, 11, 12, 13, 14, 15, 16, 17, 18, 19, 20, 22, 25, 27 and 30. Additional embodiments may comprise the hydroxyl group-containing water-miscible solvent in an amount from about 1% to about 10%, or from about 1% to about 8% by weight of the composition.

Organosilicon Compound

The etching compositions of the present invention comprise an organosilicon compound. The organosilicon compound functions primarily to protect the silicon oxide such that the silicon nitride is etched selectively and substantially exclusively.

In some embodiments, the organosilicon compound is at least one organosilicon compound having a chemical structure represented by Formula A:

$$(R^4O)_{3-m}SiR^2R^3_m \qquad A$$

wherein $R^2$ and $R^3$ are each independently selected from a hydrogen atom, a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group, a $C_2$ to $C_{10}$ linear or branched alkynyl group, and a functional group-containing moiety, wherein the functional group is at least one selected from the group consisting of vinyl, epoxy, styryl, methacyloxy, acyloxy, amino, ureide, isocycanate, isocyanurate, and mercapto; $R^4$ is selected from a $C_1$ to $C_{10}$ linear alkyl group, a $C_3$ to $C_{10}$ branched alkyl group, a $C_3$ to $C_{10}$ cyclic alkyl group, a $C_1$ to $C_{10}$ linear or branched alkenyl group, and a $C_1$ to $C_{10}$ linear or branched alkynyl group, a $C_5$-$C_{12}$ aryl group and wherein m=0, 1, or 2. Exemplary compounds of Formula A include, but are not limited to, trimethoxymethylsilane, dimethoxydimethylsilane, triethoxymethylsilane, diethoxydimethylsilane, trimethoxysilane, dimethoxymethylsilane, di-isopropyldimethoxysilane, diethoxymethylsilane, dimethoxyvinylmethylsilane, dimethoxydivinylsilane, diethoxyvinylmethylsilane, and diethoxydivinylsilane.

Examples of compounds of Formula A where $R^2$, for example, is a functional group-containing moiety, wherein the functional group is at least one selected from the group consisting of vinyl, epoxy, styryl, methacyloxy, acyloxy, amino, ureide, isocycanate, isocyanurate, and mercapto include vinyltrimethoxysilane and vinyltriethoxysilane which are vinyl-functional-group-containing examples of Formula A; 2-(3,4 epoxycyclohexyl) ethyltrimethoxysilane, 3-Glycidoxypropyl methyldimethoxysilane, 3-Glycidoxypropyl trimethoxysilane, 3-Glycidoxypropyl methyldiethoxysilane and 3-Glycidoxypropyl triethoxysilane which are epoxy-functional-group-containing examples of Formula A; p-styryltrimethoxysilane which is a styryl-functional-group-containing example of Formula A; 3-methacryloxypropyl methyldimethoxysilane; 3-methacryloxypropyl trimethoxysilane; 3-methacryloxypropyl methyldiethoxysilane and 3-Methacryloxypropyl triethoxysilane which are methacryloxy-functional-group-containing examples of Formula A; 3-Acryloxypropyl trimethoxysilane which is an acryloxy-functional-group-containing example of Formula A; N-2-(Aminoethyl)-3-aminopropylmethyldimethoxysilane, N-2-(Aminoethyl)-3-aminopropyltrimethoxysilane, 3-Aminopropyltrimethoxysilane, 3-Aminopropyltriethoxysilane, 3-Triethoxysilyl-N-(1,3 dimethyl-butylidene) propylamine, N-Phenyl-3-aminopropyltrimethoxysilane, and N-(vinylbenzyl)-2-aminoethyl-3-aminopropyltrimehoxysilane hydrochloride which are amino-functional-group-containing examples of Formula A; and 3-ureidopropyltrialkoxysilane which is an ureide-functional-group-containing example of Formula A; 3-isocyanatepropyltriethoxysilane which is an isocyanate-functional-group-containing example of Formula A; tris-(trimethoxysilylpropyl)isocyanurate which is an isicyanurate-functional-group-containing example of Formula A; and 3-mercaptopropylmethyldimethoxysilane and 3-mercaptopropyltrimethoxysilane which are mercapto-functional-group-containing examples of Formula A.

Without intending to be bound by a particular theory, it is believed that the organosilicon compound once added reacts with the water and forms a hydrolysis product once in the presence of water. The rate of hydrolysis of etch group on silicon typically depends on the solution pH and water concentration. For example, hydrolysis of trimethoxymethylsilane can proceed both under acidic and basic conditions. It is believed that the hydroxyl groups in the hydrolyzed organosilicon compound either react with or associate somehow with the hydroxyl groups on the surface of the silicon substrate to generate a protective layer thus allowing for significantly increased selectivity for silicon nitride.

It is believed that, for most applications, the amount of the organosilicon compound will comprise from about 0.001% to about 15% by weight of the composition. Preferably, when employed, the organosilicon compound comprises from about 0.1% to about 10% by weight of the composition. The amount of organosilicon compound in the composition of this invention may be any amount defined by a range having any combination of the endpoints selected from the following weight percents: 0.001, 0.01, 0.1, 1, 2, 3, 4, 5, 6, 7, 8, 9, 10, 11, 12, 13, 14, and 15, for examples, from about 0.1% to about 12%, or from about 0.1% to about 8% by weight of the composition.

Silicic Acid (Optional)

The etching compositions disclosed herein optionally include silicic acid. If employed, the silicic acid aids in protecting the silicon oxide and increasing the selectivity of the silicon nitride etch.

If employed, the amount of silicic acid will typically comprise from about 0.001% to about 5.0% by weight of the composition and, preferably, from about 0.01% by weight to about 2.0% by weight. In other embodiments, when employed, the silicic acid comprises from about 0.02% to about 0.08% by weight of the composition. The amount of silicic acid in the composition of this invention may be any amount defined by a range having any combination of the endpoints selected from the following weight percents: 0, 0.001, 0.003, 0.004, 0.005, 0.007, 0.01, 0.03, 0.05, 0.07, 0.09, 0.1, 0.3, 0.5, 0.7, 0.9, 1, 2, 3, 4, 5, 6, 7 and 8, for examples, from about 0.001% to about 3%, or from about 0.01% to about 3% by weight of the composition.

Triethyl Phosphate (Optional)

The etching compositions disclosed herein optionally include a phosphate compound, such as, for example, triethyl phosphate (TEPO) and/or trimethyl phosphate (TMPO). If employed, the phosphate compound functions as a supplemental solvent.

If employed, the amount of phosphate compound, such as, triethyl phosphate will typically comprise from about 0.05% to about 15% by weight of the composition and, preferably, from about 0.1% by weight to about 5% by weight. In other embodiments, when employed, the triethyl phosphate comprises about 2% by weight of the composition. The amount of phosphate compound in the composition of this invention may be any amount defined by a range having any combination of the endpoints selected from the following weight percents: 0, 0.05, 0.1, 0.5, 1, 2, 3, 4, 5, 6, 7, 8, 9, 10, 11, 12, 13, 14 and 15, for examples, from about 0.5% to about 8% or from about 1% to about 6% by weight of the composition. In yet other embodiments, the compositions may be substantially free of or free of added phosphorus-containing components other than the phosphoric acid.

Surfactants (Optional)

The compositions of the present invention optionally comprise at least one water-soluble nonionic surfactant. Surfactants serve to aid in the removal of residue.

Examples of the water-soluble nonionic dispersing agents include polyoxyethylene lauryl ether, polyoxyethylene cetyl ether, polyoxyethylene steary ether, polyoxyethylene oleyl ether, polyoxyethylene higher alcohol ether, polyoxyethylene octyl phenyl ether, polyoxyethylene nonyl phenyl ether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol monostearate, polyethylene glycol distearate, polyethylene glycol monooleate, polyoxyethylene alkylamine, polyoxyethylene hardened castor oil, alkylalkanolamide, and mixtures thereof.

It is believed that for most applications, if present the surfactant will comprise from about 0.001 wt. % to about 5 wt. % of the composition, preferably from about 0.01 wt. % to about 2.5 wt. % and, most preferably, from about 0.1 wt. % to about 1.0 wt. % of the composition. The amount of surfactant in the composition of this invention may be any amount defined by a range having any combination of the endpoints selected from the following weight percents: 0, 0.001, 0.003, 0.004, 0.005, 0.007, 0.01, 0.03, 0.05, 0.07, 0.09, 0.1, 0.3, 0.5, 0.7, 0.9, 1, 1.5, 2, 2.5, 3, 3.5, 4 and 5, for examples, from about 0.005 wt. % to about 4 wt. %, or from about 0.01 wt. % to about 3 wt. % of the composition.

In some embodiments the compositions of this invention will be free of or substantially free of any or all of the above-listed surfactants added to the composition.

Other Optional Ingredients

The etching composition of the present invention may also include one or more metal chelating agents. Metal chelating agents may function to increase the capacity of the composition to retain metals in solution and to enhance the dissolution of metallic residues. Typical examples of chelating agents useful for this purpose are the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N', N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, 8-hydroxyquinoline, and cysteine. Preferred chelating agents are aminocarboxylic acids such as EDTA, CyDTA and aminophosphonic acids such as EDTMP.

It is believed that, for most applications, the chelating agent will be present in the composition in an amount of from about 0.1 wt. % to about 10 wt. %, preferably in an amount of from about 0.5 wt. % to about 5 wt. % of the composition.

In some embodiments the compositions of this invention will be free of or substantially free of any or all of the above-listed chelating agents added to the composition.

The etching solution composition of the present invention is typically prepared by mixing the components together in a vessel at room temperature until all solids have dissolved in the aqueous-based medium.

Method

In another aspect there is provided herein a method of selectively enhancing the etch rate of silicon nitride relative to silicon dioxide on a composite semiconductor device (or microelectronic device) comprising silicon nitride and silicon dioxide, the method comprising the steps of: contacting the composite semiconductor device (or microelectronic device) comprising silicon nitride and silicon dioxide with a composition comprising, consisting essentially of, or consisting of: water; phosphoric acid solution (aqueous); an organosilicon compound having a chemical structure represented by Formula A:

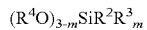

$(R^4O)_{3-m}SiR^2R^3_m$      A wherein $R^2$ and $R^3$ are each independently selected from a hydrogen atom, a $C_1$ to $C_{10}$ linear alkyl group, a $C_3$ to $C_{10}$ branched alkyl group, a $C_3$ to $C_{10}$ cyclic alkyl group, a $C_5$ to $O_{12}$ aryl group, a $C_2$ to $C_{10}$ linear or branched alkenyl group, a $C_2$ to $C_{10}$ linear or branched alkynyl group, and a functional group-containing moiety, wherein the functional group is at least one selected from the group consisting of vinyl, epoxy, styryl, methacyloxy, acyloxy, amino, ureide, isocycanate, isocyanurate, and mercapto; $R^4$ is selected from a $C_1$ to $C_{10}$ linear alkyl group, a $C_3$ to $C_{10}$ branched alkyl group, a $C_3$ to $C_{10}$ cyclic alkyl group, a $C_3$ to $C_{10}$ linear or branched alkenyl group, and a $C_3$ to $C_{10}$ linear or branched alkynyl group, a $C_5$-$C_{12}$ aryl group and wherein m=0, 1, or 2; and a hydroxyl group-containing water-miscible solvent; and rinsing the composite semiconductor device (or microelectronic device) after the silicon nitride is at least partially removed, wherein the selectivity of the etch for silicon nitride over silicon oxide is over about 1000. An additional drying step may also be included in the method. "At least partially removed" means removal of at least 90% of the material, preferably at least 95% removal. Most preferably, at least 99% removal using the compositions of the present development.

The contacting step can be carried out by any suitable means such as, for example, immersion, spray, or via a single wafer process. The temperature of the composition during the contacting step is preferably from about 100 to 200° C. and more preferably from about 140 to 180° C. Even more preferably, the temperature of the composition during the contacting step is about 160° C.

In preferred embodiments, the etch selectivity of silicon nitride over silicon oxide observed with the composition of the present invention is typically over from about 1500, more preferably over from about 2000, and most preferably over from about 2500.

The rinsing step is carried out by any suitable means, for example, rinsing the substrate with de-ionized water by immersion or spray techniques. In preferred embodiments, the rinsing step is carried out employing a mixture of de-ionized water and a water-miscible organic solvent such as, for example, isopropyl alcohol.

The drying step is carried out by any suitable means, for example, isopropyl alcohol (IPA) vapor drying, heat, or by centripetal force.

In some embodiments, the wafers may be pretreated by contacting them with a diluted hydrofluoric acid (DHF) which may be a H2O:HF=100:1 composition for 10 seconds to 10 minutes. In some embodiments the pretreatment may be performed for 3 minutes.

The features and advantages are more fully shown by the illustrative examples discussed below.

Examples

General Procedure for Preparing the Etching Compositions

All compositions which are the subject of the present Examples were prepared by mixing the components in a 250 mL beaker with a 1" Teflon-coated stir bar. Typically, the first material added to the beaker was deionized (DI) water. Phosphoric acid is typically added next followed by the hydroxyl-containing water-miscible solvent and then the remaining components.

Compositions of the Substrate

Each test 20 mm×20 mm coupon employed in the present examples comprised a layer of silicon nitride, $Si_3N_4$, on a silicon substrate. Additional examples comprised a layer of silicon oxide, $SiO_2$, on a silicon substrate to determine the etch rate of the silicon oxide.

Processing Conditions

Etching tests were run using 100 g of the etching compositions in a 250 ml beaker with a ½" round Teflon stir bar set at 300 rpm. The etching compositions were heated to a temperature of about 160° C. on a hot plate. The test coupons were immersed in the compositions for about 8 (SiNx) to 60 (SiOx) minutes while stirring. The SiN test coupons were pretreated with 1:100 DHF in a beaker at room temperature for 3 mins, rinsing and drying and afterwards to contact the test coupons with the etching composition for 8 minutes at 160° C.

The segments were then rinsed for 3 minutes in a DI water bath or spray and subsequently dried using filtered nitrogen. The silicon nitride and silicon oxide etch rates were estimated from changes in the thickness before and after etching and was measured by spectroscopic ellipsometry (MG-1000, Nano-View Co., Ltd., South Korea). Typical starting layer thickness was 4395 Å for $Si_3N_4$ and 229 Å for $SiO_2$.

The following series of Tables show the evaluation of several aspects of the compositions evaluated.

TABLE 1

Solvent Addition

| Component | 85% $H_3PO_4$ | Ex. 106-4 | Ex. 106-5 | Ex. 106-6 | Ex. 106-7 | Ex. 106-8 | Ex. 106-9 |
|---|---|---|---|---|---|---|---|
| 85% $H_3PO_4$ | 100.0 | 70.0 | 70.0 | 70.0 | 70.0 | 90.0 | 90.0 |
| DMSO | | 30.0 | | | | | |
| sulfolane | | | 30.0 | | | | |
| propylene glycol | | | | 30.0 | | 10.0 | |
| di-propylene glycol methyl ether | | | | | 30.0 | | 10.0 |
| Total | 100.0 | 100.0 | 100.0 | 100.0 | 100.0 | 100.0 | 100.0 |
| SiN E/R (Å/min) | 111 | 54 | 98 | 115 | 97 | 116 | 112 |
| SiOx E/R (Å/min) | 3.3 | 1.7 | 1.9 | 1.1 | 0.7 | 2.1 | 3.1 |
| SiN to SiOx selectivity | 33.6 | 31.8 | 51.6 | 104.5 | 138.6 | 55.2 | 36.1 |

The process conditions for Table 1 test coupons were 160° C. for 20 minutes.

The results in Table 1 show that, with the addition of various solvents, etching of $SiO_2$ was suppressed. Addition of DMSO decreased etch rates of both $Si_3N_4$ and $SiO_2$ without change of selectivity. Addition of Sulfolane more decreased etch rate of $SiO_2$ with a selectivity increase to 54. Addition of PG and DPGME which have —OH groups greatly suppressed the etching rate of $SiO_2$ with increases of selectivity to 104 and 137, respectively. However, when PG and DPGME were added, the etchant became viscous and sticky after heating. Amount of PG and DPGME addition was reduced to 10 wt % to reduce etchant viscosity. The decrease in the etching of $SiO_2$ was smaller with 10 wt % than with 30 wt % addition. Since the etching of $Si_3N_4$ was not significantly affected, etch selectivity was still higher than just 85% $H_3PO_4$, but much lower than that with 30 wt % addition of PG and DPGME. Although the amount of additives were reduced to 10 wt %, the etchant solutions were still viscous and sticky.

TABLE 2

Evaluation of Hydroxyl Group-Containing Solvents

| Component | 85% $H_3PO_4$ | Ex. 106-6 | Ex. 106-7 | Ex. 113-1 | Ex. 113-2 | Ex. 113-2 |
|---|---|---|---|---|---|---|
| 85% $H_3PO_4$ | 100.0 | 70.0 | 70.0 | 70.0 | 70.0 | 70.0 |
| propylene glycol | | 30.0 | | | | |
| di-propylene glycol methyl ether | | | 30.0 | | | |
| ethylene glycol | | | | 30.0 | | |
| glycerol | | | | | 30.0 | |
| α-terpineol | | | | | | 30.0 |
| Total | 100.0 | 100.0 | 100.0 | 100.0 | 100.0 | 100.0 |
| SiN E/R (Å/min) | 111 | 115 | 97 | 88 | 93 | 119 |
| SiOx E/R (Å/min) | 3.3 | 1.1 | 0.7 | 2.4 | 1.6 | 3.4 |
| SiN to SiOx selectivity | 33.6 | 104.5 | 138.6 | 36.7 | 58.1 | 35.0 |

The process conditions for Table 2 test coupons were 160° C. for 20 minutes.

The etching rates of $Si_3N_4$ and $SiO_2$ decreased with addition of EG and Glycol. However, the suppression of etching of $SiO_2$ was not as huge as observed in PG and DPGME. Addition of α-terpineol did not significantly change etching rates of both $Si_3N_4$ and $SiO_2$. Finally, the gain of etch selectivity was not as huge as observed in PG and DPGME. With the addition of EG, bubbling occurred in the etchant solution. With the addition of glycol, the solution became sticky when the temperature was raised, but less than that of PG or DPGME.

TABLE 3

Evaluation of Organosilicon Compounds

| Composition | 85% $H_3PO_4$ | 85% $H_3PO_4$ + 0.1M ammonium fluorosilicate (($NH_4$)$_2$$SiF_6$) | 85% $H_3PO_4$ + 0.1M silicic acid | 85% $H_3PO_4$ + 0.1M tetraethyl orthosilicate (TEOS) | 85% $H_3PO_4$ + 0.1M HF | 85% $H_3PO_4$ + 0.1M silicic acid + 0.03M HF | 85% $H_3PO_4$ + 0.1M TEOS + 0.03M HF |
|---|---|---|---|---|---|---|---|
| SiN E/R (Å/min) | 111 | 1592 | 110 | 104 | 316 | 245 | 259 |
| SiOx E/R (Å/min) | 3.3 | >112 | 0.4 | 0.3 | 20.5 | 0.8 | 0.7 |
| SiN to SiOx selectivity | 33.6 | <14.2 | 275.0 | 346.7 | 15.4 | 306.3 | 370.0 |

The process conditions for contacting each composition with the coupons tested for which the results are reported in Table 3 were 160° C. for 20 minutes. SiN wafers were pretreated with DHF for 3 mins and after rinsing and drying.

$(NH_4)_2SiF_6$ contains Si with a large amount of F, thus the etching rates were very fast. The $SiO_2$ film was completely removed in two minutes with 0.1 M addition. With the addition of silicic acid and TEOS, etching rate of $SiO_2$ greatly decreased with selectivities of 268 and 312, respectively. This is due to their similar chemical structures to $SiO_2$. Without intending to be bound by a particular theory, silicic acid and TEOS may contribute to the formation of $SiO_2$ and reduce the etching of $SiO_2$.

$$Si(OH)_4 \rightarrow SiO_2 + 2H_2O \text{ (Equilibrium in water)}.$$

$$Si(OC_2H_5)_4 + 4H_2O \rightarrow Si(OH)_4 + 4C_2H_5OH \text{ (hydrolysis)}$$

$$Si(OH)_4 \rightarrow SiO_2 + 2H_2O \text{ (condensation)}$$

Since high etch selectivities were obtained with the addition of silicic acid and TEOS, HF (0.03M) was added in the presence of silicic acid and TEOS to increase the etching rate of $Si_3N_4$. The addition of HF in silicic acid and TEOS increased the etching rate of $SiO_2$ twice. However, since the etching rate of $Si_3N_4$ increased more, the selectivity increased to 312 and 370. Addition of both HF and Si-based additives successfully increased etching rate of $Si_3N_4$ with a high etch selectivity of $Si_3N_4$ to $SiO_2$. Thus far, etching rate of $Si_3N_4$ at ~260 Amin and etch selectivity of 370 are the best.

TABLE 4

Evaluation of Silicic Acid Addition

| Chemical | 85% $H_3PO_4$ | Ex. 28-1 | Ex. 28-2 | Ex. 28-3 |
|---|---|---|---|---|
| 85% $H_3PO_4$ | 100.000 | 99.950 | 99.980 | 99.995 |
| Silicic acid | | 0.050 | 0.020 | 0.005 |
| Total | 100.000 | 100.000 | 100.000 | 100.000 |
| SiN E/R (A/min) | 192 | 182 | 185 | 191 |
| SiOx E/R (A/min) | 2.94 | 0.09 | 0.52 | 3.00 |
| SiN to SiOx selectivity | 65.3 | 2022.2 | 355.8 | 63.7 |

For the results reported in Table 4, the process for treating the SiN test coupons was to pretreat with 1:100DHF in a beaker at room temperature for 3 mins and after rinsing and drying to contact the test coupons with the etching composition for 8 minutes at 160° C. The process for treating the SiOx test coupons was to contact the test coupons with each etching composition for 60 minutes at 160° C.

With the decrease in silicic acid concentration from 0.05 to 0.005 wt %, $Si_3N_4$ increased, but $SiO_2$ ER increased more, thus $Si_3N_4/SiO_2$ selectivity decreased. $H_3PO_4$+0.005 wt % silicic acid increased $SiO_2$ ER by x20 and $Si_3N_4$ ER by ~9%, as compared to $H_3PO_4$+0.05 wt % silicic acid. It is concluded that the concentration of silicic acid should be around 0.05 wt % to have 2000:1 etch selectivity. However, the silicic acid contained chemicals showed oxide regrowth (on the silicon oxide) causing a clogging problem (which means that the silicon nitride layer was blocked by the regrowth preventing the etching composition from reaching the silicon nitride layers on the patterned structure.

TABLE 5

Addition of Trimethoxymethyl Silane (TMMS)

| Chemical | 85% $H_3PO_4$ | Ex. 505-1 | Ex. 505-2 | Ex. 505-3 |
|---|---|---|---|---|
| 85% $H_3PO_4$ | 100.00 | 97.64 | 98.00 | 98.41 |
| Trimethoxymethyl silane (TMMS) | | 2.36 | 2.00 | 1.59 |
| Total | 100.00 | 100.00 | 100.00 | 100.00 |
| SiN E/R (A/min), @R.T./3 mins | 192 | 140 | 142 | 147 |
| SiOx E/R (A/min), | 2.94 | 0.05 | 0.03 | 0.12 |
| SiN to SiOx selectivity | 65.3 | 2800.0 | 4733.3 | 1225.0 |

For the results reported in Table 5, the process for treating the SiN test coupons was to pretreat with 1:100DHF in a beaker at room temperature for 3 mins and then after rinsing and drying to contact the test coupons with each etching composition for 8 minutes at 160° C. The process for treating the SiOx test coupons was to contact the test coupons with each etching composition for 60 minutes at 160° C.

With the 2 wt %, TMMS etch selectivity was higher than the target selectivity, 2000:1. $H_3PO_4$+1.59 wt % TMMS did not meet selectivity 2000:1, because the ER of $SiO_2$ increased more. No oxide regrowth and clogging problem was observed on pattern structure by processing with TMMS contained chemicals.

TABLE 6

| Chemical | Ex. 505-2 | Ex. YL-001 | Ex. YL-002 | Ex. 119A | Ex. 119B |
|---|---|---|---|---|---|
| 85% $H_3PO_4$ | 98.00 | 93.00 | 95.00 | 95.40 | 95.80 |
| Trimethoxymethyl silane (TMMS) | 2.00 | 2.00 | 2.00 | 1.60 | 1.20 |
| TEPO | | 5.00 | 3.00 | 3.00 | 3.00 |
| Total | 100.00 | 100.00 | 100.00 | 100.00 | 100.00 |
| Miscibility@R.T. (as prep.) | cloudy | transparent | transparent | transparent | transparent |
| Miscibility@R.T. (24 h aged) | cloudy | slightly opaque | slightly opaque | slightly opaque | transparent |
| Miscibility@160 C. | transparent | transparent | transparent | transparent | transparent |
| Miscibility@R.T. (after test, cool down) | transparent | transparent | transparent | transparent | transparent |
| SiN E/R (A/min) | 142 | 133 | 138 | 143 | 147 |
| SiOx E/R (A/min) | 0.03 | 0.17 | 0.05 | 0.1 | 0.16 |
| SiN to SiOx selectivity | 4733.3 | 782.4 | 2760.0 | 1430.0 | 918.8 |

For the results reported in Table 6, the process for treating the SiN test coupons was to pretreat with 1:100DHF in a beaker at room temperature for 3 mins, rinsing and drying the test coupons and then contacting the test coupons with each etching composition for 8 minutes at 160° C. The process for treating the SiOx test coupons was to contact the test coupons with each etching composition for 60 minutes at 160° C. without a pretreatment step.

As-prepared Examples YL-001 and YL-002 without A1 were transparent, but became slightly opaque after 24 h stirring. Both became transparent after boiling at 160° C. YL-002 showed selectivity of 2,760, which was higher than target selectivity, 2000:1. YL-001 showed selectivity of 782, which was lower than target because $SiO_2$ ER was x3 higher than YL-002. As-prepared, Example 119A was transparent but became slightly opaque after 24 h stirring. It became transparent after boiling at 160° C. and it was still transparent after cooling down to RT. Example 119B contains 1.2 wt % TMMS, it was transparent at all four time points. Example 119A and B showed selectivity of 1,430 and 919, respectively, which was lower than the target selectivity, 2000:1. As the concentration of TMMS added to $H_3PO_4$+3 wt % TEPO decreased, both $Si_3N_4$ and $SiO_2$ ER increased. Because increase in the $SiO_2$ ER was larger than that of $Si_3N_4$ ER, etch selectivity decreased with lower TMMS concentration.

TABLE 7

| Chemical | Ex. YL-002 | Ex. 119G | Ex. 119E | Ex. 119N |
|---|---|---|---|---|
| 85% $H_3PO_4$ | 95.00 | 93.00 | 93.00 | 95.00 |
| Trimethoxymethyl silane (TMMS) | 2.00 | 2.00 | 2.00 | 2.00 |
| TEPO | 3.00 | | | |
| Acetic acid | | 5.00 | | |
| Ethanol | | | 5.00 | |
| Ethyl acetate | | | | 3.00 |
| Total | 100.00 | 100.00 | 100.00 | 100.00 |
| Miscibility@R.T. (as prep.) | transparent | opaque | transparent | transparent |
| Miscibility@R.T. (24 h aged) | slightly opaque | cloudy | cloudy | opaque |
| Miscibility@160 C. | transparent | transparent | transparent | transparent |
| Miscibility@R.T. (after test, cool down) | transparent | transparent | transparent | transparent |
| SiN E/R (A/min) | 138 | 148 | 146 | 145 |
| SiOx E/R (A/min) | 0.05 | 0.1 | 0.05 | 0.07 |
| SiN to SiOx selectivity | 2760.0 | 1480.0 | 2920.0 | 2071.4 |

For the results reported in Table 7, the process for treating the SiN test coupons was to pretreat with 1:100DHF in a beaker at room temperature for 3 mins and then after rinsing and drying the test coupons to contact the test coupons with each etching composition for 8 minutes at 160° C. The process for treating the SiOx test coupons was to contact the test coupons with each etching composition for 60 minutes at 160° C. without a pretreatment step.

Example 119G was opaque and became cloudy after 24 h stirring. It became transparent after boiling at 160° C. and it was still transparent after cooling down to RT. Example 119E was transparent but became cloudy after 24 h stirring. It became transparent after boiling at 160° C. and it was still transparent after cooling down to RT. Example 119N was transparent but became opaque after 24 h stirring. It became transparent after boiling at 160° C. and it was still transparent after cooling down to RT. Example 119G showed selectivity of 1480, which was lower than target selectivity. Example 119E showed selectivity of 2920 which was higher than target selectivity, 2000:1. Example 119N showed selectivity of 2071 which was higher than target selectivity, 2000:1. The added solvent with lower polarity showed better miscibility (ethyl acetate>ethanol>acetic acid), but Ex. 119E showed better selectivity, so we focused on studying the effects from alcohols in the following tests. In some embodiments, solvents having a polarity less than 0.8, or less than 0.7 or less than 0.6 or less than 0.5 or less than 0.4 or less than 0.3 were preferred, where water has a polarity of 1. Additionally or alternatively, in some embodiments, solvents having fewer than 10 carbons may be preferred or fewer than 8 carbons or fewer than 7 carbons.

TABLE 8

| Chemical | Ex. 119E | Ex. 119M | Ex. 119P | Ex. 119Q |
|---|---|---|---|---|
| 85% $H_3PO_4$ | 93.00 | 93.00 | 95.00 | 95.00 |
| Trimethoxymethyl silane (TMMS) | 2.00 | 2.00 | 2.00 | 2.00 |
| Ethanol | 5.00 | | | |
| Isopropanol | | 5.00 | | |
| 2-Butanol | | | 3.00 | |
| 2-Methyl-2-propanol | | | | 3.00 |
| Total | 100.00 | 100.00 | 100.00 | 100.00 |
| Miscibility@R.T. (as prep.) | transparent | slightly opaque | transparent | transparent |
| Miscibility@R.T. (24 h aged) | cloudy | opaque | opaque | transparent |
| Miscibility@160° C. | transparent | slightly opaque, slightly yellowish | transparent | transparent, slightly yellowish |
| Miscibility@R.T. (after test, cool down) | transparent | slightly opaque, slightly yellowish | transparent | transparent, slightly yellowish |
| SiN E/R (A/min) | 146 | 148 | 158 | 153 |
| SiOx E/R (A/min) | 0.05 | 0.07 | 0.14 | 0.06 |
| SiN to SiOx selectivity | 2920.0 | 2114.3 | 1128.6 | 2550.0 |

For the results reported in Table 8, the process for treating the SiN test coupons was to pretreat with 1:100DHF in a beaker at room temperature for 3 mins and then after rinsing and drying the test coupons to contact the test coupons with each etching composition for 8 minutes at 160° C. The process for treating the SiOx test coupons was to contact the test coupons with each etching composition for 60 minutes at 160° C. without a pretreatment step.

Example 119M was slightly opaque and it became more opaque after stirring for 24 h. It was still opaque and yellowish after boiling at 160° C. and even after cooling down to room temperature. Example 119P was transparent but became opaque after stirring for 24 hours. It became transparent after boiling at 160° C. and it was still transparent after cooling down to room temperature (RT). Example 119Q was transparent and it was still transparent after stirring for 24 hours. It was also transparent, but became slightly yellowish after boiling at 160° C. and cooling down to RT. Example 119M showed selectivity of 2114, which was higher than target selectivity, 2000:1. Example 119P showed selectivity of 1129 Amin, which was lower than target selectivity. Example 119Q showed selectivity of 2550 Amin, which was higher than target selectivity, 2000:1. Example 119Q met the target selectivity and showed good miscibility. Additionally, the performance of Example 119Q on a patterned structure showed that no thinning of SiOx layer and no oxide regrowth while SiN layer is totally removed.

Table 9: Performance of Select Formulations

TABLE 9A

Patterned wafers:

| Etchant | Process Time (min) | $Si_3N_4$ ER | $Si_3N_4$ ER to H3PO4 | $Si_3N_4$ ER bottom/top (%) | Oxide Regrowth/ viscosity |
|---|---|---|---|---|---|
| $H_3PO_4$ | 2.5 | >116 | 1 | 107 | |
| | 5 | >102 | 1 | 85 | |
| | 10 | >107 | 1 | 78 | |
| | 20 | >99 | 1 | 108 | regrowth |
| | 30 | >95 | 1 | 107 | regrowth |
| $H_3PO_4$ + 0.05 wt % silicic acid | 2.5 | 120 | 1 | 174 | |
| | 5 | 112 | 1.1 | 104 | |
| | 10 | 110 | 1 | 126 | regrowth and clogging |
| | 20 | 96 | 1 | 117 | regrowth and clogging |
| | 30 | 100 | 1.1 | 114 | regrowth and clogging |
| $H_3PO_4$ + 2 wt % TMMS | 2.5 | 88 | 0.8 | 83 | |
| | 5 | 94 | 0.9 | 121 | |
| | 10 | 79 | 0.7 | 131 | |
| | 20 | 91 | 0.9 | 97 | |
| | 30 | 77 | 0.8 | 109 | |

TABLE 9A

Blanket Wafer ($Si_3N_4$ for 8 min, SiO2 for 1 hour)

| $Si_3N_4$ ER | $Si_3N_4$ ER to $H_3PO_4$ | $SiO_2$ ER | Selectivity ($Si_3N_4/SiO_2$) |
|---|---|---|---|
| 192 | 1 | 294 | 65.3 |
| 182 | 0.95 | 0.09 | 2,022.2 |
| 142 | 0.74 | 0.03 | 4,733.3 |

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching solution suitable for the selective removal of silicon nitride over silicon oxide from a microelectronic device, consisting of:
water;
about 59.5 to about 85 wt % neat phosphoric acid;
an organosilicon compound which is selected from the group consisting of trimethoxymethylsilane, dimethoxydimethylsilane, triethoxymethylsilane, diethoxydimethylsilane, trimethoxysilane, dimethoxymethylsilane, di-isopropyldimethoxysilane, diethoxymethylsilane, dimethoxyvinylmethylsilane, dimethoxydivinylsilane, diethoxyvinylmethylsilane and diethoxydivinylsilane;
silicic acid; and
a hydroxyl group-containing water-miscible solvent.

2. The etching solution of claim 1 wherein the hydroxyl group-containing water-miscible solvent is selected from the group consisting of an alkane diol or polyol, a glycol, an alkoxyalcohol, a saturated aliphatic monohydric alcohol, an unsaturated non-aromatic monohydric alcohol, and an alcohol containing a ring structure.

3. The etching solution of claim 2 wherein the hydroxyl group-containing water-miscible solvent is the alkane diol or polyol and is selected from the group consisting of 2-methyl-1,3-propanediol, 1,3-propanediol, 2,2-dimethyl-1,3-propanediol, 1,4-butanediol, 1,3-butanediol, 1,2-butanediol, 2,3-butanediol, and pinacol.

4. The etching solution of claim 2 wherein the hydroxyl group-containing water-miscible solvent is the glycol and is selected from the group consisting of ethylene glycol, propylene glycol, diethylene glycol, dipropylene glycol, triethylene glycol and tetraethyleneglycol.

5. The etching solution of claim 2 wherein the hydroxyl group-containing water-miscible solvent is the alkoxyalcohol and is selected from the group consisting of 3-methoxy-3-methyl-1-butanol, 3-methoxy-1-butanol, 1-methoxy-2-butanol, and a glycol monoether.

6. The etching solution of claim 5 wherein the hydroxyl group-containing water-miscible solvent is the glycol monoether and is selected from the group consisting of ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy- 1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether and ethylene glycol monobenzyl ether, and diethylene glycol monobenzyl ether.

7. The etching solution of claim 2 wherein the hydroxyl group-containing water-miscible solvent is the saturated aliphatic monohydric alcohol and is selected from the group consisting of methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

8. The etching solution of claim 2 wherein the hydroxyl group-containing water-miscible solvent is the unsaturated non-aromatic monohydric alcohol and is selected from the group consisting of allyl alcohol, propargyl alcohol, 2-butenyl alcohol, 3-butenyl alcohol, and 4-penten-2-ol.

9. The etching solution of claim 2 wherein the hydroxyl group-containing water-miscible solvent is the alcohol containing a ring structure and is selected from the group consisting of alpha-terpineol, tetrahydrofurfuryl alcohol, furfuryl alcohol, and 1,3-cyclopentanediol.

10. The etching solution of claim 1 wherein the hydroxyl group-containing water-miscible solvent is di-propylene glycol monoethyl ether (DPGME).

11. The etching solution of claim 10 wherein the di-propylene glycol monoethyl ether (DPGME) is present in an amount of from about 5% by weight to about 15% by weight.

12. The etching solution of claim 1 wherein the organosilicon compound is trimethoxymethylsilane.

13. A method of selectively enhancing the etch rate of silicon nitride relative to silicon dioxide on a microelectronic device comprising silicon nitride and silicon dioxide, the method comprising the steps of: contacting the microelectronic device comprising silicon nitride and silicon dioxide with the composition of claim 1; and rinsing the microelectronic device after the silicon nitride is at least partially removed, wherein the selectivity of the etch for silicon nitride over silicon oxide is over about 100.

14. The method of claim 13 further comprising the step of drying the microelectronic device.

15. The method of claim 13 wherein the selectivity of the etch for silicon nitride over silicon oxide is from about 100 to about 5000.

16. The method of claim 13 wherein the selectivity of the etch for silicon nitride over silicon oxide is from about 125 to about 5000.

17. The method of claim 13 wherein the contacting step is performed at a temperature of about 160° C.

* * * * *